(12) United States Patent
Katine

(10) Patent No.: US 9,472,753 B1
(45) Date of Patent: Oct. 18, 2016

(54) METHOD FOR FABRICATING MRAM BITS ON A TIGHT PITCH

(71) Applicant: HGST Netherlands B.V., Amsterdam (NL)

(72) Inventor: Jordan A. Katine, Mountain View, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 0 days.

(21) Appl. No.: 14/728,778

(22) Filed: Jun. 2, 2015

(51) Int. Cl.
H01L 27/22 (2006.01)
H01L 43/12 (2006.01)

(52) U.S. Cl.
CPC ............ *H01L 43/12* (2013.01); *H01L 27/222* (2013.01)

(58) Field of Classification Search
CPC ................ H01L 21/02365; H01L 21/02436; H01L 21/02518
See application file for complete search history.

(56) References Cited

U.S. PATENT DOCUMENTS

| | | | |
|---|---|---|---|
| 7,645,618 B2 | 1/2010 | Ditizio | |
| 7,936,027 B2 | 5/2011 | Xiao et al. | |
| 8,564,079 B2 | 10/2013 | Kang et al. | |
| 8,796,795 B2 | 8/2014 | Satoh et al. | |
| 2007/0054450 A1 | 3/2007 | Hong et al. | |
| 2010/0053823 A1* | 3/2010 | Iwayama | B82Y 25/00 360/324.2 |
| 2011/0076784 A1 | 3/2011 | Druist et al. | |
| 2011/0235217 A1 | 9/2011 | Chen et al. | |
| 2013/0029431 A1 | 1/2013 | Takahashi et al. | |
| 2013/0149499 A1* | 6/2013 | Lee | H01L 43/12 428/156 |
| 2014/0170776 A1 | 6/2014 | Satoh et al. | |
| 2014/0248718 A1 | 9/2014 | Kim et al. | |
| 2015/0021725 A1* | 1/2015 | Hsu | H01L 43/08 257/421 |
| 2015/0069480 A1* | 3/2015 | Kanaya | H01L 27/222 257/295 |
| 2015/0069560 A1* | 3/2015 | Cho | H01L 43/02 257/421 |

OTHER PUBLICATIONS

Takahashi, S., Ion-Beam-Etched Profile Control of MTJ Cells for Improving the Switching Characteristics of High-Density MRAM, Magnetics, IEEE Transactions on , vol. 42, No. 10, pp. 2745,2747, Oct. 2006 doi: 10.1109/TMAG.2006.878862 <http://ieeexplore.ieee.org/stamp/stamp.jsp?tp=&arnumber=1704425&isnumber=35967>.

(Continued)

*Primary Examiner* — Cheung Lee
(74) *Attorney, Agent, or Firm* — Patterson & Sheridan, LLP

(57) ABSTRACT

A method for fabricating magnetoresistive random access memory (MRAM) devices on a tight pitch is provided. The method generally includes etching a pattern of columns into a hardmask layer disposed on a magnetic tunnel junction (MTJ) disposed on a substrate having electrically conductive contacts, the MTJ comprising a tunnel barrier layer between first and second ferromagnetic layers, the pattern of columns aligned to the electrically conductive contacts; etching the first ferromagnetic layer to expose the tunnel barrier layer and to form columns comprising the hardmask layer and the first ferromagnetic layer; forming a passivation layer on the exposed tunnel barrier layer and on top side surfaces of the columns; and etching the passivation layer on the exposed tunnel barrier layer, the exposed tunnel barrier layer, and the second ferromagnetic layer to form columns comprising the hardmask layer, the first ferromagnetic layer, the tunnel barrier layer, and the second ferromagnetic layer.

12 Claims, 5 Drawing Sheets

(56) References Cited

OTHER PUBLICATIONS

Young Soo Song, Influence of Wet Chemical Cleaning on Properties of Magnetic Tunnel Junction Stack for Magnetic RAM, Electrochemical and Solid-State Letters, 7 (5) C64-C66 (2004) The Electrochemical Society, Inc. <http://dspace.inha.ac.kr/bitstream/10505/20396/1/Influence%20of%20Wet.pdf>.

Kiyokazu Nagahara et al, Magnetic Tunnel Junction (MTJ) Patterning for Magnetic Random Access Memory (MRAM) Process Applications, Japanese Journal of Applied Physics, vol. 42, Part 2, No. 5B (May 2003) <http://iopscience.iop.org/1347-4065/42/5B/L499>.

* cited by examiner

METHOD FOR FABRICATING MRAM BITS ON A TIGHT PITCH

BACKGROUND

1. Field of the Disclosure

Aspects of the present disclosure generally relate to data storage systems, and more particularly, to techniques for fabricating magnetic random access memory (MRAM) bits on a tight pitch.

2. Description of the Related Art

Higher storage bit densities in magnetic media used in disk drives have reduced the size (volume) of magnetic bits. Magnetic random access memory (MRAM) offers fast access time, infinite read/write endurance, radiation hardness, and high storage density. Unlike conventional RAM chip technologies, MRAM data is not stored as electric charge, but is instead stored by magnetic polarization of storage elements. The elements are formed from two magnetically polarized plates, each of which can maintain a magnetic polarization field, separated by a thin insulating layer, which together form a magnetic tunnel junction (MTJ) layer. MRAM cells including MTJ memory elements can be designed for in-plane or perpendicular magnetization of the MTJ layer structure with respect to the film surface. One of the two plates is a permanent magnet (i.e., has fixed magnetization) set to a particular polarity; the polarization of the other plate will change (i.e., has free magnetization) to match that of a sufficiently strong external field. Therefore, the cells have two stable states that allow the cells to serve as non-volatile memory elements.

A memory device may be built from a grid of such cells. The MRAM cells in an array on a chip are connected by metal word and bit lines. Each memory cell is connected to a word line and a bit line. The word lines connect rows of cells, and bit lines connect columns of cells. Typically complementary metal-oxide semiconductor (CMOS) structures include a selection transistor which is electrically connected to the MTJ stack through the top or bottom metal contacts. The direction of the current flow is between top or bottom metal electrodes.

Reading the polarization state of an MRAM cell is accomplished by measuring the electrical resistance of the cell's MTJ. A particular cell is conventionally selected by powering an associated transistor that switches current from a supply line through the MTJ layer to a ground. Due to the tunneling magnetoresistance effect, the electrical resistance of the cell changes due to the relative orientation of the polarizations in the two magnetic layers of the MTJ. By measuring the resulting current, the resistance inside any particular cell can be determined, and from this the polarity of the free writable (free) layer determined. If the two layers have the same polarization, this is considered to mean State "0", and the resistance is "low," While if the two layers are of opposite polarization the resistance will be higher and this means State "1". Data is written to the cells using a variety of techniques. In conventional MRAM, an external magnetic field is provided by current in a wire in proximity to the cell, which is strong enough to align the free layer. Spin-transfer-torque (STT) MRAM uses spin-aligned ("polarized") electrons to directly torque the domains of the free layer. Such polarized electrons flowing into the free layer exert a sufficient torque to realign (e. g., reverse) the magnetization of the free layer.

Ion Beam Etching (IBE) (i.e., ion milling) has been widely used in various industries for patterning thin films. Etching and re-deposition may occur simultaneously. When the deposition rate is larger than the etching rate, redeposition material accumulates on the sidewall. When the etching rate is higher, the sidewall is cleaned up. Shallow slope is helpful for preventing the re-deposition. The higher or more vertical the slope, the more susceptible it is to re-deposition since the lateral component of etch rate in directional etching ambient such as IBE is, in general, less than the vertical component. When a conductive material is re-deposited on the MTJ sidewall at the barrier layer, the top and bottom magnetic layers are shorted.

One significant determinant of a memory system's cost is the density of the components. Smaller components, and fewer components for each cell, enable more cells to be packed onto a single chip, which in turn means more chips can be produced at once from a single semiconductor wafer and fabricated at lower cost and improved yield. At large pitch (e.g., 5F), MRAM bits may be formed with little to no re-deposition on the sidewall as shown in FIG. 1 but with a lower density of bits. At tight pitch (e.g., 2F), MRAM bits may be formed with a higher density; however, re-deposition of etched material on the sidewall is a serious concern, because it can make it the device inoperable by forming an electrical short across the barrier layer, for example, as shown in FIG. 2.

Therefore, a need exists in the art for MRAM bit fabrication at tight pitch.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Aspects of the present disclosure generally relate data storage systems, and more particularly, to techniques for fabricating MRAM bits on a tight pitch.

In one aspect, a method for fabricating a MRAM device is provided. The method generally includes etching a pattern of columns into a hardmask layer disposed on a MTJ stack that is disposed on a substrate having one or more electrically conductive contacts, wherein the MTJ stack comprises a tunnel barrier layer between first and second ferromagnetic layers, and wherein the pattern of columns is aligned to the one or more electrically conductive contacts, etching the first ferromagnetic layer to expose the tunnel barrier layer and to form columns comprising the hardmask layer and the first ferromagnetic layer, forming a passivation layer on the exposed tunnel barrier layer and on top surfaces and side surfaces of the columns, and etching the passivation layer on the exposed tunnel barrier layer, the exposed tunnel barrier layer, and the second ferromagnetic layer to form columns comprising the hardmask layer, the first ferromagnetic layer, the tunnel barrier layer, and the second ferromagnetic layer.

In another aspect, a method for fabricating a MRAM device is provided. The method generally includes etching a pattern of columns into a hardmask layer disposed on a MTJ stack that is disposed on a substrate having one or more electrically conductive contacts, wherein the MTJ stack comprises a tunnel barrier layer between first and second ferromagnetic layers, and wherein the pattern of columns is aligned to the one or more electrically conductive contacts, etching the first ferromagnetic layer to expose the tunnel barrier layer and to form columns comprising the hardmask layer and the first ferromagnetic layer, forming a passivation layer on the exposed tunnel barrier layer and on top surfaces and side surfaces of the columns, etching the passivation layer on the exposed tunnel barrier layer, the exposed tunnel barrier layer, and the second ferromagnetic layer to form columns comprising the hardmask layer, the first ferromagnetic layer, the tunnel barrier layer, and the second ferromagnetic layer, depositing a refill layer over the exposed one or more electrically conductive contacts and the exposed substrate, wherein the refill layer fills space between adjacent columns, and chemical mechanical polishing the refill layer.

In yet another aspect, a method for fabricating a MRAM device is provided. The method generally includes etching a pattern of columns into a TaN hardmask layer disposed on a MT) stack that is disposed on a substrate having one or more electrically conductive contacts, wherein the MTJ stack comprises a MgO tunnel barrier layer between first and second ferromagnetic layers, wherein the pattern of columns is aligned to the one or more electrically conductive contacts, and wherein a distance between the columns is less than or equal to 5 times a width of the columns, etching the first ferromagnetic layer to expose the tunnel barrier layer and to form columns comprising the hardmask layer and the first ferromagnetic layer, forming a dielectric passivation layer on the exposed tunnel barrier layer and on top surfaces and side surfaces of the columns, etching the passivation layer on the exposed tunnel barrier layer, the exposed tunnel barrier layer, and the second ferromagnetic layer to form columns comprising the hardmask layer, the first ferromagnetic layer, the tunnel barrier layer, and the second ferromagnetic layer, wherein the etched second ferromagnetic layer has a width greater than a width of the columns comprising the first ferromagnetic layer and the hardmask layer, and wherein etching the second ferromagnetic layer exposes the one or more electrically conductive contacts and the substrate, depositing a refill layer over the exposed one or more electrically conductive contacts and the exposed substrate, wherein the refill layer fills space between adjacent columns, and chemical mechanical polishing the refill layer.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Aspects of the present disclosure generally relate to techniques for fabricating MRAM bits on a tight pitch. According to certain aspects, a multi-step etching technique may be used which may prevent redeposition from shorting out tightly spaced devices (i.e., devices at tight pitch).

In the following description of aspects of the present disclosure, reference is made to the accompanying drawings that form a part hereof, and in which is shown by way of illustration of the specific implementations in which the disclosure may be practiced. It should be noted that the figures discussed herein are not drawn to scale and do not indicate actual or relative sizes. Any hatching in the figures is used to distinguish layers and does not represent the type of material used. A plurality of arrays of MRAM cells are typically fabricated simultaneously on a single wafer. The figures and description herein reference only a few cells of the plurality of cells that will be typically be fabricated simultaneously on a single wafer.

Figure 1:
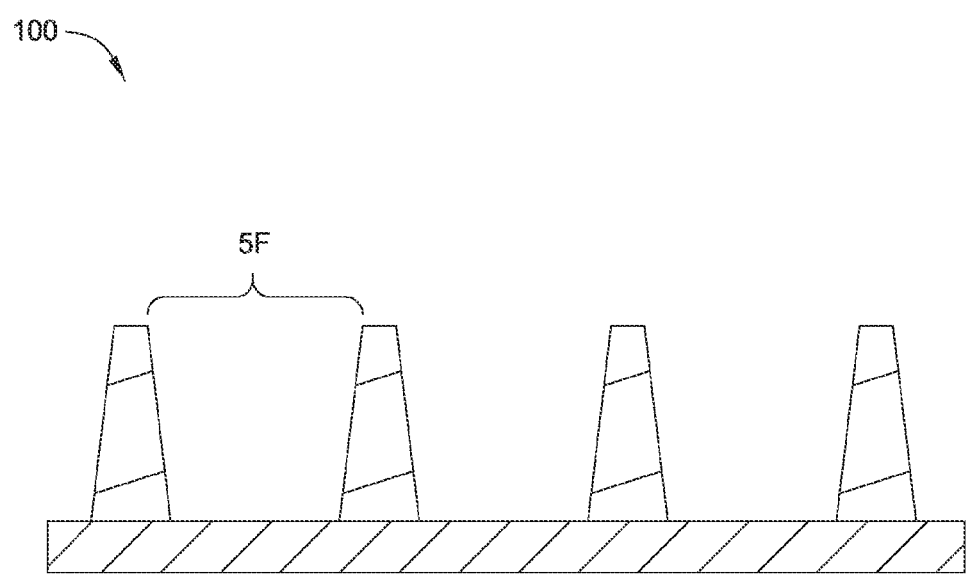
FIG. 1 illustrates a schematic diagram of MRAM bits patterned at a pitch of 5F, according to certain aspects of the present disclosure.
Figure 2:
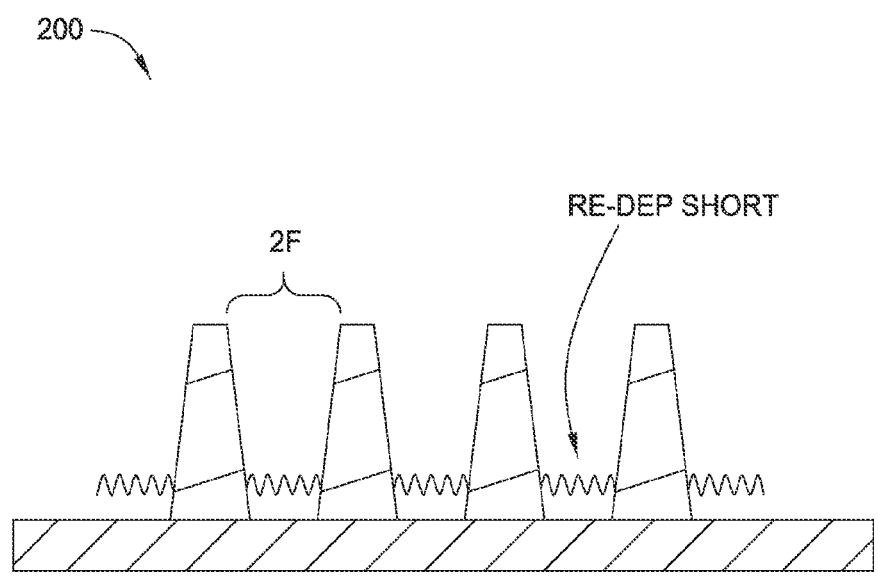
FIG. 2 illustrates a schematic diagram of MRAM bits patterned at a pitch of 2F, according to certain aspects of the present disclosure.
Figure 3:
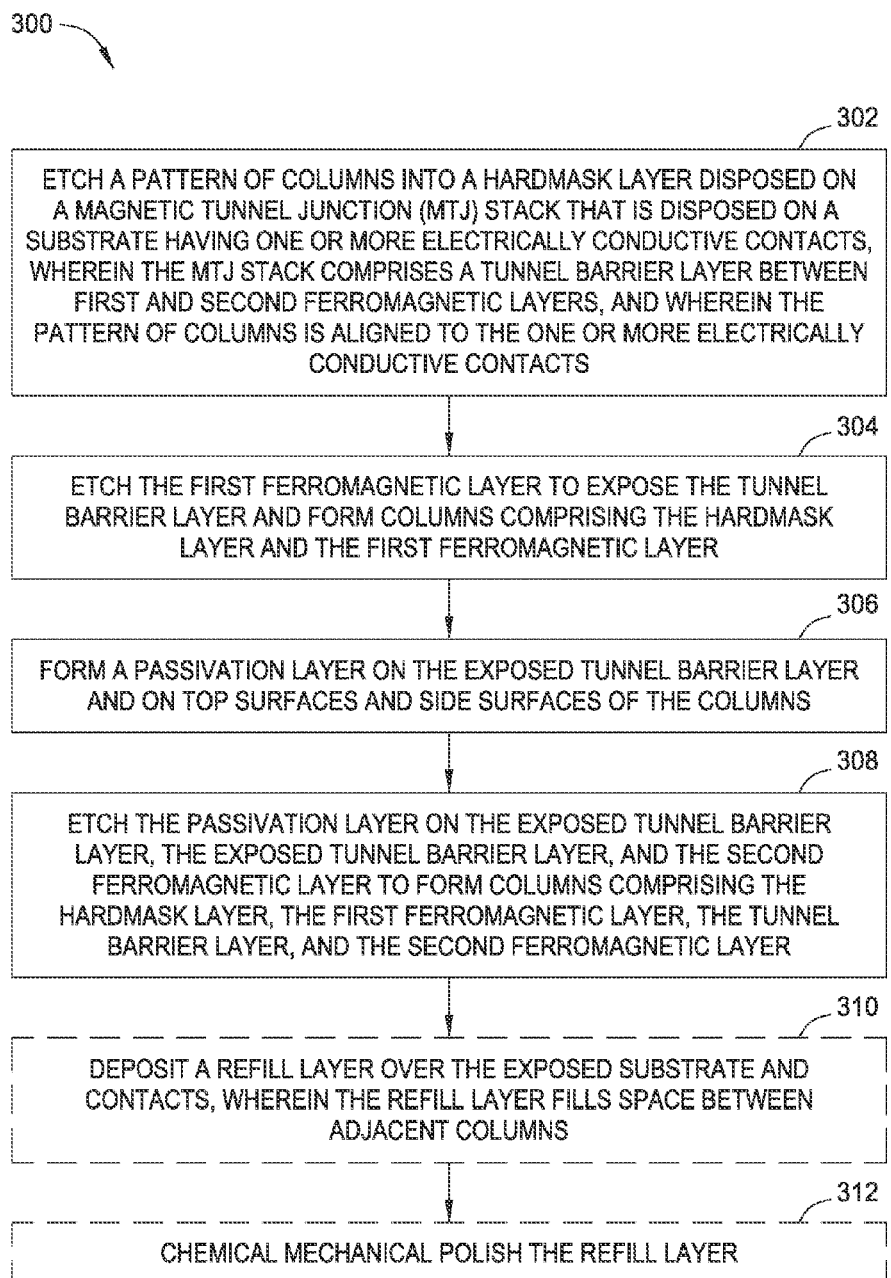
FIG. 3 is a block diagram illustrating example operations for fabricating MRAM bits at a pitch, according to certain aspects of the present disclosure.

FIG. 3 is a block diagram illustrating example operations 300 for fabricating MRAM bits at a pitch, according to certain aspects of the present disclosure. The operations 300 are also illustrated in FIGS. 4-4E which provide cross-section views of example layers of an MRAM device and are discussed in more detail below.

Figure 4:
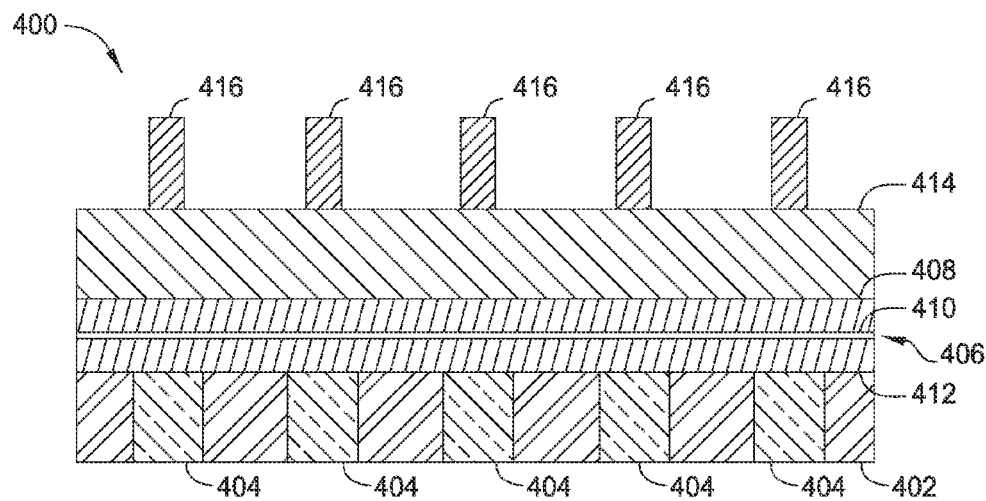
FIGS. 4-4E are cross-section views of example layers of an MRAM device illustrating the operations of FIG. 3, according to certain aspects of the present disclosure.

As shown in FIG. 4, the MRAM device 400 may include a substrate 402 (e.g., a wafer). The substrate 402 may include a plurality of electrical contacts 404 (e.g., electrodes). A MTJ stack 406 may be disposed on the substrate 402. The MTJ stack 406 may include the first ferromagnetic layer 408 (e.g., a free magnetization layer such as a CoFeB layer), a tunnel barrier layer 410 (e.g., a MgO layer), and the second ferromagnetic layer 412 (e.g., a fixed magnetization layer such as a CoFeB layer). As shown in FIG. 4, the second ferromagnetic layer 412 may be disposed (e.g., formed) on the substrate 402 and in contact with the electrical contacts 404. The tunnel barrier layer 410 (e.g., a thin MgO layer where quantum tunneling may occur) may be disposed on the second ferromagnetic layer 412, and the first ferromagnetic layer 408 may be disposed on the tunnel barrier layer 410. A hardmask layer 414 (e.g., a TaN hardmask) may be disposed on the MTJ stack 406. Although not shown in the drawings, the MRAM device 400 may also include a capping layer, above the first ferromagnetic layer 408, and appropriate seed and pinning layers below the second ferromagnetic layer 412.

Figure 4A:
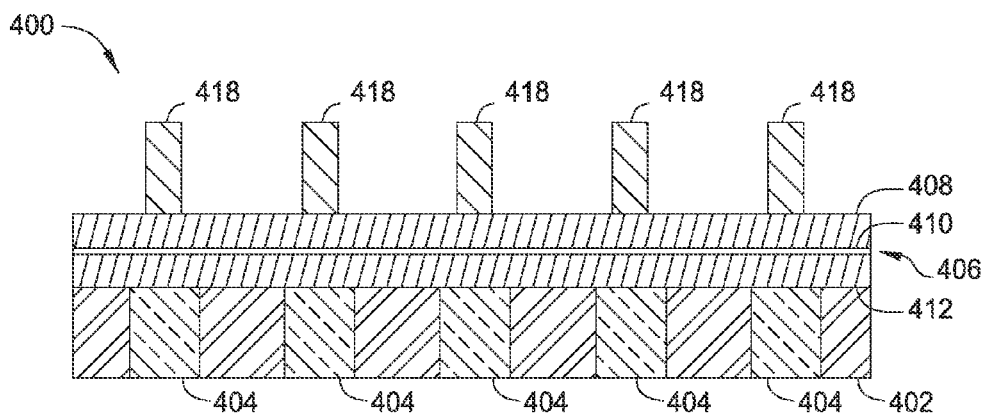

Referring back to FIG. 3, at block 302, a pattern of columns may be etched into a hardmask layer disposed on a MTJ stack that is disposed on a substrate having one or more electrically conductive contacts, wherein the MTJ stack comprises a tunnel barrier layer between first and second ferromagnetic layers, and wherein the pattern of columns is aligned to the one or more electrically conductive contacts. For example, as shown in FIG. 4, a pattern resist 416 may be used on the hardmask layer 414. The pattern resist 416 may include a plurality of columns and may be aligned such that the plurality of columns is aligned with the electrical contacts 404 on the substrate 402. The hardmask layer 414 may then be lithographically etched (e.g., using reactive ion etching) in order to transfer the pattern of columns into the hardmask layer 414 to form the columns 418 as shown in FIG. 4A. The columns 418 may serve as top electrodes.

Figure 4B:
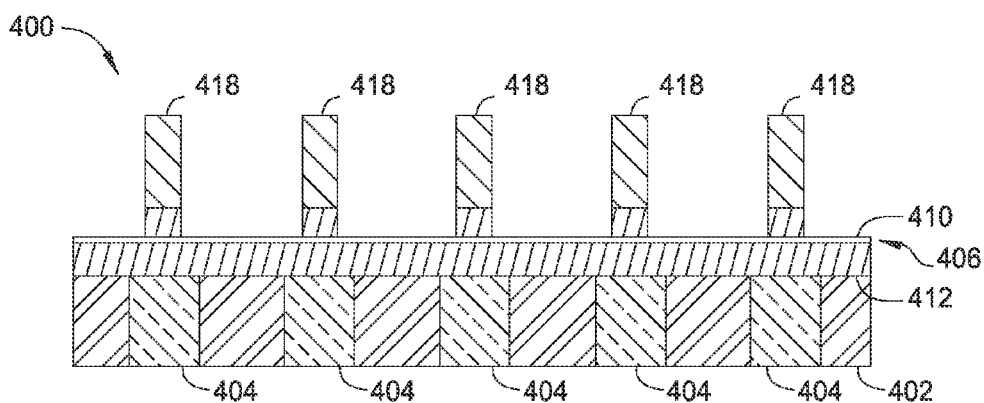

Referring back to FIG. 3, at block 304, the first ferromagnetic layer of the MTJ stack may be etched to expose the tunnel barrier layer and to form columns comprising the hardmask layer and the first ferromagnetic layer. As shown in FIG. 4A, the hardmask layer 414 may be etched to expose the MTJ stack 406 between the columns 418. As shown in FIG. 4B, the first ferromagnetic layer 408 may be then etched, stopping once the tunnel barrier layer 410 is exposed.

Figure 4C:
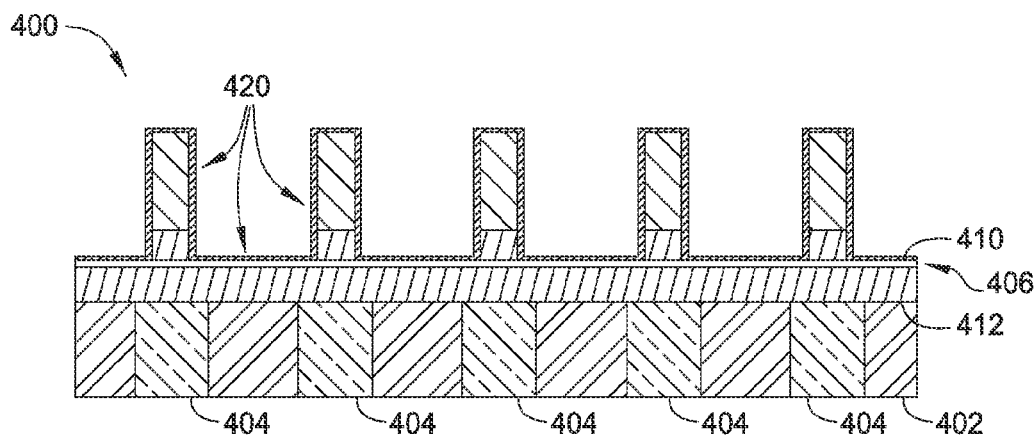

Referring back to FIG. 3, at block 306, a passivation layer may be formed on the exposed tunnel barrier layer and on top surfaces and side surfaces of the columns. For example, as shown in the FIG. 4C, a passivation layer 420 (e.g., an oxide or nitride layer) may be formed on the top surfaces and on the side surfaces of the columns 418 as well as on the exposed tunnel barrier layer 410.

Figure 4D:
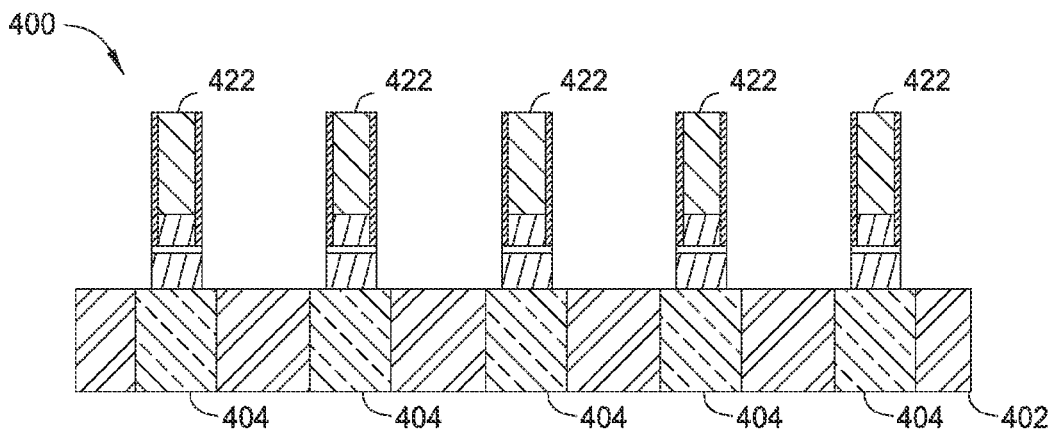
Figure 4E:
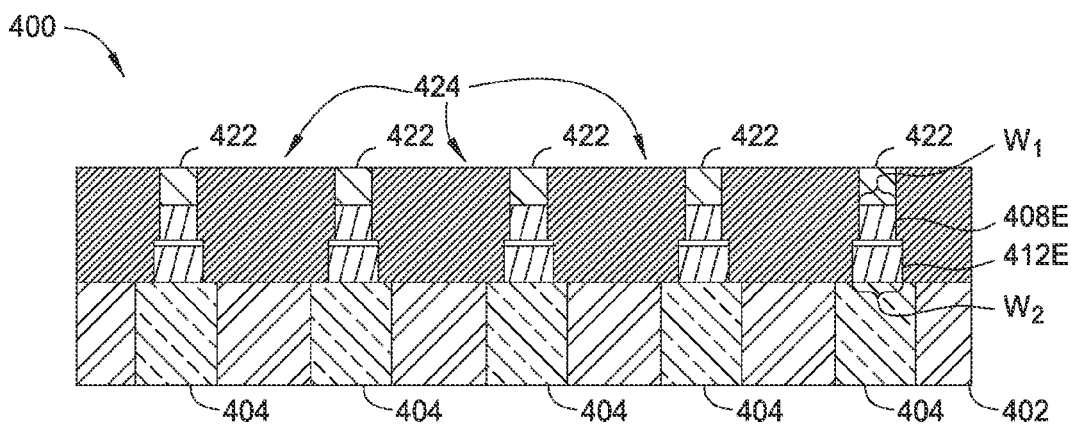

Referring back to FIG. 3, at block 308, the passivation layer on the exposed tunnel barrier layer, the exposed tunnel barrier layer, and the second ferromagnetic layer of the MTJ stack may be etched to form columns comprising the hardmask layer, the first ferromagnetic layer, the tunnel barrier layer, and the second ferromagnetic layer. For example, as shown in FIG. 4D, the passivation layer 420 on the tunnel barrier layer 410 (but not on the top surfaces or side surfaces of the columns 418), the tunnel barrier layer 410, and the second ferromagnetic layer 412 may be etched, forming columns 422. The columns 422 may include the portions of the passivation layer 420 on the top and side surfaces, the etched hardmask layer, and the etched MTJ stack. The columns 422 may be aligned with the electrical contacts 404. As shown in the FIG. 4D, the width of the etched second ferromagnetic layer may be wider than the width of the etched hardmask and first ferromagnetic layers by an amount equal to the width of the passivation layer formed on the side surfaces of the columns 418. For example, as shown in FIG. 4E, the etched first ferromagnetic layer 408E may have a width $w_1$ and the etched second ferromagnetic layer may have a width $w_2$. The difference between the width of the layer ($w_2-w_1$) may be equal to the width of the passivation layer 420.

According to certain aspects, the tunnel barrier layer 410 is protected from redeposition by the passivation layer 420.

According to certain aspects, the columns 422 may be formed at a tight pitch (e.g., 2F).

Referring back to FIG. 3, at block 310, a refill layer may be deposited over the exposed substrate and contacts, wherein the refill layer fills space between adjacent columns and, at block 312, the refill layer may be chemical mechanical polished (CMP). For example, as shown in FIG. 4E, the refill layer 424 may be formed to fill the space between the columns 422.

In summary, a multi-step etching technique is disclosed which may be used to prevent redeposition from shorting out tightly spaced MRAM bits by forming a passivation layer to protect the tunnel barrier layer before completing etching the MTJ stack and before redeposition occurs.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various operations of methods described above may be performed by any suitable means capable of performing the corresponding functions. The means may include various hardware and/or software component(s).

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for fabricating a magnetoresistive random access memory (MRAM) device, comprising:
    etching a pattern of first columns into a hardmask layer disposed on a magnetic tunnel junction (MTJ) stack that is disposed on a substrate having one or more electrically conductive contacts, wherein the MTJ stack comprises a tunnel barrier layer between first and second ferromagnetic layers, and wherein the pattern of first columns is aligned to the one or more electrically conductive contacts, wherein the hardmask layer is disposed on and in contact with the first ferromagnetic layer;
    etching the first ferromagnetic layer to expose the tunnel barrier layer and to form second columns comprising the hardmask layer and the first ferromagnetic layer;

forming a passivation layer on the exposed tunnel barrier layer and on top surfaces and side surfaces of the second columns; and etching the passivation layer on the exposed tunnel barrier layer, the exposed tunnel barrier layer, and the second ferromagnetic layer to form third columns comprising the hardmask layer, the first ferromagnetic layer, the tunnel barrier layer, and the second ferromagnetic layer, wherein etching the second ferromagnetic layer exposes the one or more electrically conductive contacts and the substrate.

2. The method of claim 1, further comprising depositing a refill layer over the exposed one or more electrically conductive contacts and the exposed substrate, wherein the refill layer fills space between adjacent columns.

3. The method of claim 2, further comprising chemical mechanical polishing the refill layer.

4. A method for fabricating a magnetoresistive random access memory (MRAM) device, comprising:

etching a pattern of first columns into a hardmask layer disposed on a magnetic tunnel junction (MTJ) stack that is disposed on a substrate having one or more electrically conductive contacts, wherein the MTJ stack comprises a tunnel barrier layer between first and second ferromagnetic layers, and wherein the pattern of first columns is aligned to the one or more electrically conductive contacts, wherein the hardmask layer is disposed on and in contact with the first ferromagnetic layer;

etching the first ferromagnetic layer to expose the tunnel barrier layer and to form second columns comprising the hardmask layer and the first ferromagnetic layer;

forming a passivation layer on the exposed tunnel barrier layer and on top surfaces and side surfaces of the second columns;

etching the passivation layer, the exposed tunnel barrier layer, and the second ferromagnetic layer to form third columns comprising the hardmask layer, the first ferromagnetic layer, the tunnel barrier layer, and the second ferromagnetic layer to expose the substrate and the one or more electrically conducive contacts;

depositing a refill layer over the exposed one or more electrically conductive contacts and the exposed substrate, wherein the refill layer fills space between adjacent third columns; and chemical mechanical polishing the refill layer.

5. The method of claim 4, wherein a distance between the third columns is less than or equal to 5 times a width of the third columns.

6. The method of claim 4, wherein the hardmask layer comprises TaN.

7. The method of claim 4, wherein the tunnel barrier layer comprises MgO.

8. The method of claim 4, wherein the etching a pattern of first columns is performed using reactive ion etching.

9. The method of claim 4, wherein the passivation layer comprises a dielectric layer.

10. The method of claim 4, wherein the passivation layer comprises an oxide layer or a nitride layer.

11. The method of claim 4, wherein the etched second ferromagnetic layer has a width greater than a width of the columns comprising the first ferromagnetic layer and the hardmask layer.

12. A method for fabricating a magnetoresistive random access memory (MRAM) device, comprising:

etching a pattern of columns into a TaN hardmask layer disposed on a magnetic tunnel junction (MTJ) stack that is disposed on a substrate having one or more electrically conductive contacts, wherein the MTJ stack comprises a MgO tunnel barrier layer between first and second ferromagnetic layers, wherein the pattern of columns is aligned to the one or more electrically conductive contacts, and wherein a distance between the columns is less than or equal to 5 times a width of the columns, wherein the hardmask layer is disposed on and in contact with the first ferromagnetic layer;

etching the first ferromagnetic layer to expose the tunnel barrier layer and to form columns comprising the hardmask layer and the first ferromagnetic layer;

forming a dielectric passivation layer on the exposed tunnel barrier layer and on top surfaces and side surfaces of the columns;

etching the dielectric passivation layer on the exposed tunnel barrier layer, the exposed tunnel barrier layer, and the second ferromagnetic layer to form columns comprising the hardmask layer, the first ferromagnetic layer, the tunnel barrier layer, and the second ferromagnetic layer, wherein the etched second ferromagnetic layer has a width greater than a width of the columns comprising the first ferromagnetic layer and the hardmask layer, and wherein etching the second ferromagnetic layer exposes the one or more electrically conductive contacts and the substrate;

depositing a refill layer over the exposed one or more electrically conductive contacts and the exposed substrate, wherein the refill layer fills space between adjacent columns; and chemical mechanical polishing the refill layer.

* * * * *